(12) United States Patent
Francis et al.

(10) Patent No.: US 8,759,200 B2
(45) Date of Patent: Jun. 24, 2014

(54) METHODS AND APPARATUS FOR SELECTIVE EPITAXY OF SI-CONTAINING MATERIALS AND SUBSTITUTIONALLY DOPED CRYSTALLINE SI-CONTAINING MATERIAL

(75) Inventors: Terry Arthur Francis, Schenectady, NY (US); Satoshi Hasaka, Tokyo (JP); Paul David Brabant, East Greenbush, NY (US); Robert Torres, Jr., Parker, CO (US); Hong He, Schenectady, NY (US); Alexander Reznicek, Troy, NY (US); Thomas N. Adam, Singerlands, NY (US); Devendra K. Sadana, Pleasantville, NY (US)

(73) Assignees: Matheson Tri-Gas, Inc., Basking Ridge, NJ (US); International Business Machines Corporation, Armonk, NY (US)

( * ) Notice: Subject to any disclaimer, the term of this patent is extended or adjusted under 35 U.S.C. 154(b) by 265 days.

(21) Appl. No.: 13/135,031

(22) Filed: Jun. 23, 2011

(65) Prior Publication Data
US 2012/0003819 A1 Jan. 5, 2012

Related U.S. Application Data

(60) Provisional application No. 61/398,980, filed on Jul. 2, 2010.

(51) Int. Cl.
*H01L 21/205* (2006.01)
(52) U.S. Cl.
USPC .......................................................... 438/478
(58) Field of Classification Search
None
See application file for complete search history.

(56) References Cited

U.S. PATENT DOCUMENTS

| | | | |
|---|---|---|---|
| 6,846,513 B2 | 1/2005 | Furusawa | |
| 6,962,859 B2 | 11/2005 | Todd | |
| 7,186,582 B2 | 3/2007 | Todd | |
| 7,648,690 B2 | 1/2010 | Bauer | |
| 2001/0000759 A1* | 5/2001 | Doley et al. | 438/488 |
| 2002/0168868 A1 | 11/2002 | Todd | |
| 2003/0036268 A1 | 2/2003 | Brabant | |
| 2005/0064684 A1* | 3/2005 | Todd et al. | 438/478 |
| 2006/0234504 A1 | 10/2006 | Bauer | |
| 2006/0237861 A1* | 10/2006 | Stamp et al. | 261/121.1 |
| 2007/0275569 A1* | 11/2007 | Moghadam et al. | 438/781 |
| 2008/0014725 A1 | 1/2008 | Todd | |
| 2008/0044932 A1* | 2/2008 | Samoilov et al. | 438/5 |
| 2008/0173239 A1* | 7/2008 | Makarov et al. | 118/724 |
| 2009/0026496 A1* | 1/2009 | Bauer et al. | 257/190 |
| 2009/0117717 A1 | 5/2009 | Tomasini | |
| 2010/0012030 A1* | 1/2010 | Todd et al. | 118/708 |
| 2011/0147828 A1* | 6/2011 | Murthy et al. | 257/327 |
| 2012/0024223 A1* | 2/2012 | Torres et al. | 117/104 |

* cited by examiner

*Primary Examiner* — Charles Garber
*Assistant Examiner* — Stanetta Isaac

(57) ABSTRACT

The present invention discloses that under modified chemical vapor deposition (mCVD) conditions an epitaxial silicon film may be formed by exposing a substrate contained within a chamber to a relatively high carrier gas flow rate in combination with a relatively low silicon precursor flow rate at a temperature of less than about 550° C. and a pressure in the range of about 10 mTorr-200 Torr. Furthermore, the crystalline Si may be in situ doped to contain relatively high levels of substitutional carbon by carrying out the deposition at a relatively high flow rate using tetrasilane as a silicon source and a carbon-containing gas such as dodecalmethylcyclohexasilane or tetramethyldisilane under modified CVD conditions.

18 Claims, 3 Drawing Sheets

METHODS AND APPARATUS FOR SELECTIVE EPITAXY OF SI-CONTAINING MATERIALS AND SUBSTITUTIONALLY DOPED CRYSTALLINE SI-CONTAINING MATERIAL

CROSS REFERENCE TO OTHER APPLICATIONS

This application claims benefit of priority to U.S. Provisional Application No. 61/398,980, filed Jul. 2, 2010, the disclosure of which is fully incorporated herein by reference.

BACKGROUND OF THE INVENTION

1. Field of the Invention

The present invention relates generally to selective epitaxy deposition of silicon-containing materials in semiconductor processing. More particularly, this application relates to selective epitaxy deposition of silicon-containing materials and substitutionally carbon-doped silicon-containing materials by using a modified chemical vapor deposition (mCVD) conditions using tetrasilane and a carbon source and an apparatus for accomplishing the same.

2. Description of the State of the Art

The relentless pursuit of scaling over the last 40 years, in accordance with the famed postulate known as Moore's Law, continues to be an aggressive goal. However, the time has come to rethink what is scalable and examine other ways of adding value to semiconductor devices. As smaller transistors are manufactured, ultra shallow source/drain junctions are becoming more challenging to produce. Generally, sub-100 nm CMOS (complementary metal-oxide semiconductor) devices require a junction depth to be less than 30 nm. Selective epitaxial deposition is often utilized to form epilayers of silicon-containing materials (e.g., Si, SiGe and SiC) into the junctions. Generally, selective epitaxial deposition permits growth of epilayers on silicon moats with no growth on dielectric areas. Selective epitaxy can be used within semiconductor devices, such as elevated source/drains, source/drain extensions, contact plugs or base layer deposition of bipolar devices.

Chemical vapor deposition (CVD) is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. Frequently, volatile by-products are also produced, which are removed by gas flow through the reaction chamber.

A number of forms of CVD are in wide use and are frequently referenced in the literature. These processes differ in the means by which chemical reactions are initiated (e.g., activation process) and process conditions. The following are but a few examples of CVD as classified by operating pressure:

Low-pressure CVD (LPCVD)—CVD processes at subatmospheric pressures ($10^{-3}$ Torr base pressure/100 mTorr-1 Torr operating pressure).

Ultrahigh vacuum CVD (UHVCVD)—CVD processes at a very low pressure, typically $10^{-9}$ Torr base/$10^{-5}$ to 50 mTorr operating pressure.

Reduced-Pressure CVD (RPCVD)—CVD process at $10^{-3}$ Torr base pressure/10 Torr to ATM operating pressure.

Very Low Pressure CVD (VLPCVD)—CVD process at $10^{-7}$ Torr base/10 mTorr to 50 mTorr operating pressure.

Generally, a selective epitaxy process involves a deposition reaction and an etch reaction. The deposition and etch reactions occur simultaneously with relatively different reaction rates to an epitaxial layer and to a polycrystalline layer. During the deposition process, the epitaxial layer is formed on a monocrystalline surface while a polycrystalline layer is deposited on at least a second layer, such as an existing polycrystalline layer and/or an amorphous layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on the spacer.

Selective epitaxy deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayers, such as a silicon germanium (SiGe) material. Selective epitaxy permits near complete dopant activation with in situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction. Typically, the elevated source/drain layer is undoped silicon.

However, current selective epitaxy processes have some drawbacks. In order to maintain selectivity during present epitaxy processes, chemical concentrations of the precursors, as well as reaction temperatures must be regulated and adjusted throughout the deposition process. If not enough silicon precursor is administered, then the etching reaction may dominate and the overall process is slowed down. If not enough etchant precursor is administered, then the deposition reaction may dominate reducing the selectivity to form monocrystalline and polycrystalline materials across the substrate surface. Also, current selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface.

The performance of semiconductors devices may be further enhanced by increasing circuit performance. The amount of current that flows through the channel of a metal oxide semiconductor (MOS) transistor is directly proportional to a mobility of carriers in the channel, and the use of high mobility MOS transistors enables more current to flow and consequently faster circuit performance. For example, mobility of the carriers in the channel of a MOS transistor can be increased by producing a mechanical stress, i.e., strain, in the channel.

A number of approaches for inducing strain in Si- and Ge-containing materials have focused on exploiting the differences in the lattice constants between various crystalline materials. In one approach, thin layers of a particular crystalline material are deposited onto a different crystalline material in such a way that the deposited layer adopts the lattice constant of the underlying single crystal material.

Strain may also be introduced into single crystalline Si-containing materials by replacing Si in the lattice structure with a dopant, commonly referred to as substitutional doping. For example, substitution of germanium atoms for some of the silicon atoms in the lattice structure of single crystalline silicon produces a compressive strain in the resulting substitutionally doped single crystalline silicon material because the germanium atoms are larger than the silicon atoms that they replace. Alternatively, a tensile strain may be introduced into single crystalline silicon by substitutional doping with carbon, because carbon atoms are smaller than the silicon atoms that they replace. See, e.g., Judy L. Hoyt, "Substitutional Carbon Incorporation and Electronic Characterization of $Si_{1-y}C_y$/Si and $Si_{1-x-y}Ge_xC_y$/Si Heterojunctions," Chapter 3 in "Silicon-Germanium Carbon Alloy," Taylor and Francis, N.Y., pp. 59-89, 2002, the disclosure of which is incorporated herein by reference.

In situ doping is often preferred over ex situ doping followed by annealing to incorporate the dopant into the lattice structure because the annealing may undesirably consume thermal budget. However, in practice in situ substitutional carbon doping is complicated by the tendency for the dopant to incorporate non-substitutionally during deposition, e.g., interstitially in domains or clusters within the silicon, rather than by substituting for silicon atoms in the lattice structure. See, e.g., the aforementioned article by Hoyt. Non-substitutional doping also complicates substitutional doping using other material systems, e.g., carbon doping of SiGe, doping of Si and SiGe with electrically active dopants, etc. As illustrated in FIG. 3.10 at page 73 of the aforementioned article by Hoyt, prior deposition methods have been used to make crystalline silicon having an in situ doped substitutional carbon content of up to 2.3 atomic %, which corresponds to a lattice spacing of over 5.4 Å and a tensile stress of less than 1.0 GPa. However, prior deposition methods are not known to have been successful for depositing single crystal silicon having an in situ doped substitutional carbon content of greater than 2.3 atomic %.

Therefore, there is a need to have a process for selectively and epitaxially depositing silicon and silicon-containing materials while accomplishing in situ substitutional doping of Si-containing materials. Desirably, such improved methods would be capable of achieving commercially significant levels of substitutional doping without unduly sacrificing deposition speed, selectivity, and/or the quality (e.g., crystal quality) of the deposited materials. Furthermore, the process should be versatile to form silicon-containing materials with varied elemental concentrations while having a fast deposition rate and maintaining a process temperature in the range of about 250° C.-550° C., and preferably about 500° C.-525° C. while maintaining a pressure of less than 200 Torr.

SUMMARY OF THE INVENTION

Deposition and/or growth methods have now been developed that utilize a silicon source and a carbon source to deposit carbon-doped Si-containing films using a modified chemical vapor deposition and/or growth system (reduced pressure chemical CVD) which operates in the range of 10 mTorr to 200 Torr. Such deposition and/or growth methods are capable of producing a variety of Si-containing single crystal films that are substitutionally doped with carbon to various levels, including levels that are significantly higher than those achieved using prior methods. For example, preferred deposition and/or growth methods using tetrasilane as a silicon source can be used to deposit a variety of carbon-doped single crystal Si films having a range of substitutional carbon levels, including levels of greater than 1.8 atomic % while simultaneously maintaining a constant reaction temperature throughout the process.

Another embodiment provides a method for depositing an epitaxial silicon film, comprising: providing a substrate disposed within a chamber; exposing the substrate to a silicon source such as tetrasilane under reduced pressure chemical vapor deposition and/or growth conditions and depositing a single silicon film onto the substrate at a temperature of less than about 550° C. and a pressure of less than about 200 Torr.

Another embodiment provides a method for depositing an epitaxial silicon film, comprising: providing a substrate disposed within a chamber; introducing tetrasilane and a carbon source to the chamber under reduced pressure CVD conditions and depositing a single crystalline silicon film onto the substrate at a temperature of less than about 550° C. and a pressure of less than about 200 Torr thereby producing a single crystalline silicon film comprising at least 1.8 atomic % substitutional carbon, as determined by x-ray diffraction.

Another embodiment provides an integrated circuit comprising a first single crystalline Si-containing region and a second single crystalline Si-containing region, at least one of the first single crystalline Si-containing region and the second single crystalline Si-containing region comprising an amount of substitutional carbon effective to exert a tensile stress on a third single crystalline Si-containing region positioned between the first single crystalline Si-containing region and the second single crystalline Si-containing region, the third single crystalline Si-containing region exhibiting an increase in carrier mobility of at least about 10% as compared to a comparable unstressed region.

In another aspect of the invention, a modified low pressure-chemical vapor deposition and/or growth system is disclosed for forming an epitaxial film on a substrate, comprising a deposition and/or growth chamber having chamber dimensions and opposite ends; a high-speed pump means connected to one of the ends of the chamber and operative to maintain the deposition and/or growth pressure in the chamber at or below 200 Torr; a gas inlet adjacent the other of the ends of the chamber for introducing gas into the chamber so that the gas flows generally in a direction from the gas inlet to the pump means; substrate support means for supporting the substrates within the chamber; and said high speed pump is capable of flowing a carrier gas into said chamber at concentrations so high that any contaminants, such as but not limited to oxygen, water, carbon monoxide, carbon dioxide, siloxanes, disiloxanes, and higher siloxanes present are diluted out.

The foregoing paragraphs have been provided by way of general introduction, and are not intended to limit the scope of the following claims. The presently preferred embodiments, together with further advantages, will be best understood by reference to the following detailed description taken in conjunction with the accompanying drawings.

BRIEF DESCRIPTION OF THE DRAWINGS

The accompanying drawings, which are incorporated in and form a part of the specifications, illustrate the preferred embodiments of the present invention, and together with the description serve to explain the principles of the invention.

In the Drawings.

DETAILED DESCRIPTION OF THE PRESENT INVENTION

Figure 1:
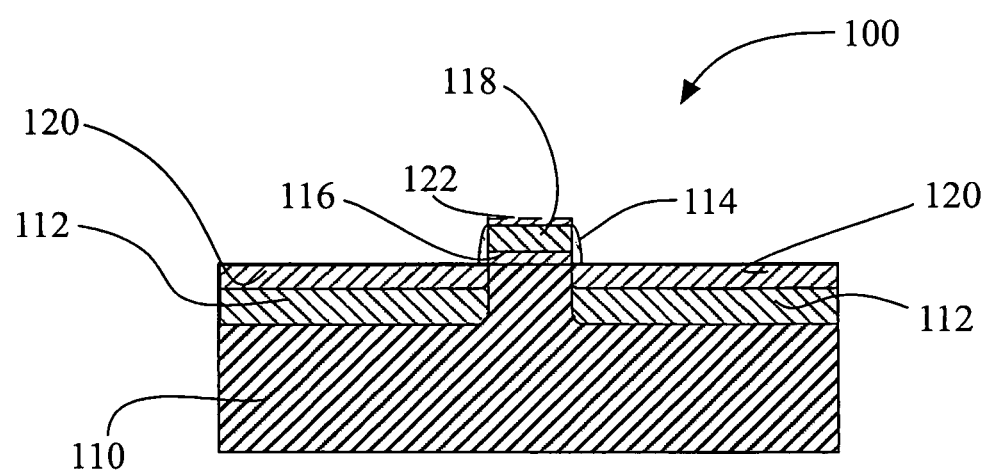
FIG. 1 shows a schematic illustration of a device containing selectively and epitaxially deposited silicon-containing layers within a MOSFET.

The present invention addresses the limitations described previously. The present invention provides a process for selectively and epitaxially depositing silicon and silicon-containing materials while accomplishing in situ substitutional doping of Si-containing materials. In addition, such improved methods disclosed herein are capable of achieving commercially significant levels of substitutional doping without unduly sacrificing deposition and/or growth speed, selectivity, and/or the quality (e.g., crystal quality) of the deposited materials. Furthermore, the process is versatile enough to form silicon-containing materials with varied elemental concentrations while having a fast deposition and/or growth rate and maintaining a process temperature in the range of about 250° C.-550° C., and preferably about 500° C.-525° C. while maintaining a pressure in the range of about 10 mTorr-200 Torr and preferably 10 mTorr-50 Torr and more preferably 10 mTorr-10 Torr. Finally, in the event the process requires multiple cycles as a result of etching there is no need to vary the temperature, that is, the etching step takes place at the same temperature as the deposition and/or growth step.

There are a number of deposition and/or growth parameters, as discussed in detail below, that are critical to selectively and epitaxially depositing silicon and silicon-containing materials while accomplishing in situ substitutional doping of Si-containing materials. It has been discovered that two critical parameters that allow one to accomplish the teachings of the present invention are the use higher order silanes including straight and isomeric forms, such as, but not limited to tetrasilane (n-tetrasilane, iso-tetrasilane and cyclo-tetrasilane) in combination with a low pressure chemical vapor deposition and/or growth system which has been modified in accordance with the present invention to incorporate the use of a high speed pump.

The use of higher order silanes, such as, but not limited to tetrasilane, enables higher deposition and/or growth rate at lower temperature and for silicon-containing films incorporating carbon, higher incorporation of substitutional carbon atoms than the use of mono-silane as a silicon source gas. Higher silanes, such as tetrasilane, while easier to deposit at lower temperatures, thereby providing greater selectivity by enabling amorphous growth versus poly crystalline material. Higher silanes have traditionally been difficult to employ in epitaxy processes as they are prone to polymerization, thus forming higher chain polymers (gas phase nucleation) which deposit in the form of particles. These particles cause defects in the Si material and can disrupt epitaxy, resulting in possible transition to amorphous or polysilicon layers depending on the temperature. Lowering the deposition and/or growth temperature reduces the potential for gas phase nucleation. Unfortunately, however, as the deposition and/or growth temperature is lowered the partial pressure of oxygen, an impurity present in the epitaxy process, increases resulting in the interstitial incorporation of oxygen into the Si material. By extrapolating the work of Lander, et al., *JAP*, v33(6): 2089-2092 (1962) at a deposition and/or growth temperature of 550° C. the partial pressure where oxygen is no longer stable on a clean surface is $10^{-16}$ Torr. Deposition and/or growth methods have now been developed for higher silanes, such as tetrasilane, that are much less sensitive to gas phase nucleation phenomena and that are useful for making a variety of substitutionally doped single crystalline Si-containing materials.

Surprisingly, it has been found that epitaxial silicon films may be formed by exposing a substrate contained within a chamber to a relatively high carrier gas flow rate in combination with a relatively low flow rate of the silicon source such as but not limited to tetrasilane by utilizing a reduced pressure CVD system having a high speed pump, at a temperature of less than about 550° C. and a pressure in the range of about 10 mTorr-200 Torr, preferably 10 mTorr-50 Torr and more preferably 10 mTorr-10 Torr. The high speed pump is capable of flowing a carrier gas into said chamber at concentrations so high that any contaminants, such as but not limited to oxygen, water, carbon monoxide, carbon dioxide, siloxanes, disiloxanes, and higher siloxanes present are diluted out.

Furthermore, the crystalline Si may be in situ doped to contain relatively high levels of substitutional carbon by carrying out the deposition and/or growth at a relatively high flow rate using terasilane as a silicon source and a carbon-containing gas as a carbon source under these modified CVD conditions. The deposition and/or growth of a single crystalline silicon film onto the substrate takes place at a temperature of less than about 550° C. and a pressure in the range of about 10 mTorr-200 Torr, preferably 10 mTorr-50 Torr and more preferably 10 mTorr-10 Torr, the single crystalline silicon film comprises about 1.8 atomic % to about 3.0 atomic % substitutional carbon, as determined by x-ray diffraction. The deposition and/or growth of carbon-doped layers in accordance with this invention can be conducted with or without an etchant gas, selectively or non-selectively, as described in greater detail below. In the event an etchant gas is employed there is the added benefit that the pressure and temperature do not need to be cycled depending upon whether the cycle is a deposition and/or growth or etching cycle.

As discussed above, various deposition and/or growth parameters have been found to affect the incorporation of substitutional carbon into Si-containing films, including: the ratio of tetrasilane to other silicon sources the ratio of carbon source flow rate to tetrasilane flow rate; the carrier gas flow rate; the deposition and/or growth pressure; and the deposition and/or growth temperature. It has been found that certain combinations of these parameters are particularly advantageous for achieving relatively high levels of substitutional carbon incorporation into Si-containing films. In particular, the following combinations are preferred: a relatively high carrier gas flow rate (e.g., a relatively low ratio of tetrasilane flow rate to hydrogen carrier gas flow rate) in combination with at least one of the following: a relatively low tetrasilane flow rate (e.g., about 50 mg/min to about 200 mg/min) a relatively low deposition and/or growth pressure (e.g., preferably in the range of from about 10 millitorr to about ten Torr and more preferably at a pressure of less than 1 Torr; and a relatively low deposition and/or growth temperature (e.g., preferably in the range of from about 250° C. to about 550° C., more preferably in the range of from about 500° C. to about 525° C.).

The term "Si-containing material" and similar terms are used herein to refer to a broad variety of silicon-containing materials including without limitation Si (including crystalline silicon), Si:C (e.g., carbon-doped crystalline Si), SiGe and SiGeC (e.g., carbon-doped crystalline SiGe). As used herein, "carbon-doped Si", "Si:C", "SiGe", "carbon-doped SiGe", "SiGe:C" and similar terms refer to materials that contain the indicated chemical elements in various proportions and, optionally, minor amounts of other elements. For example, "SiGe" is a material that comprises silicon, germanium and, optionally, other elements, e.g., dopants such as carbon and electrically active dopants. Thus, carbon-doped Si may be referred to herein as Si:C or vice versa. Terms such as "Si:C", "SiGe", and "SiGe:C" are not stoichiometric chemical formulas per se and thus are not limited to materials that contain particular ratios of the indicated elements. The percentage of a dopant (such as carbon, germanium or electrically active dopant) in a Si-containing film is expressed herein in atomic percent on a whole film basis, unless otherwise stated.

Figure 3:
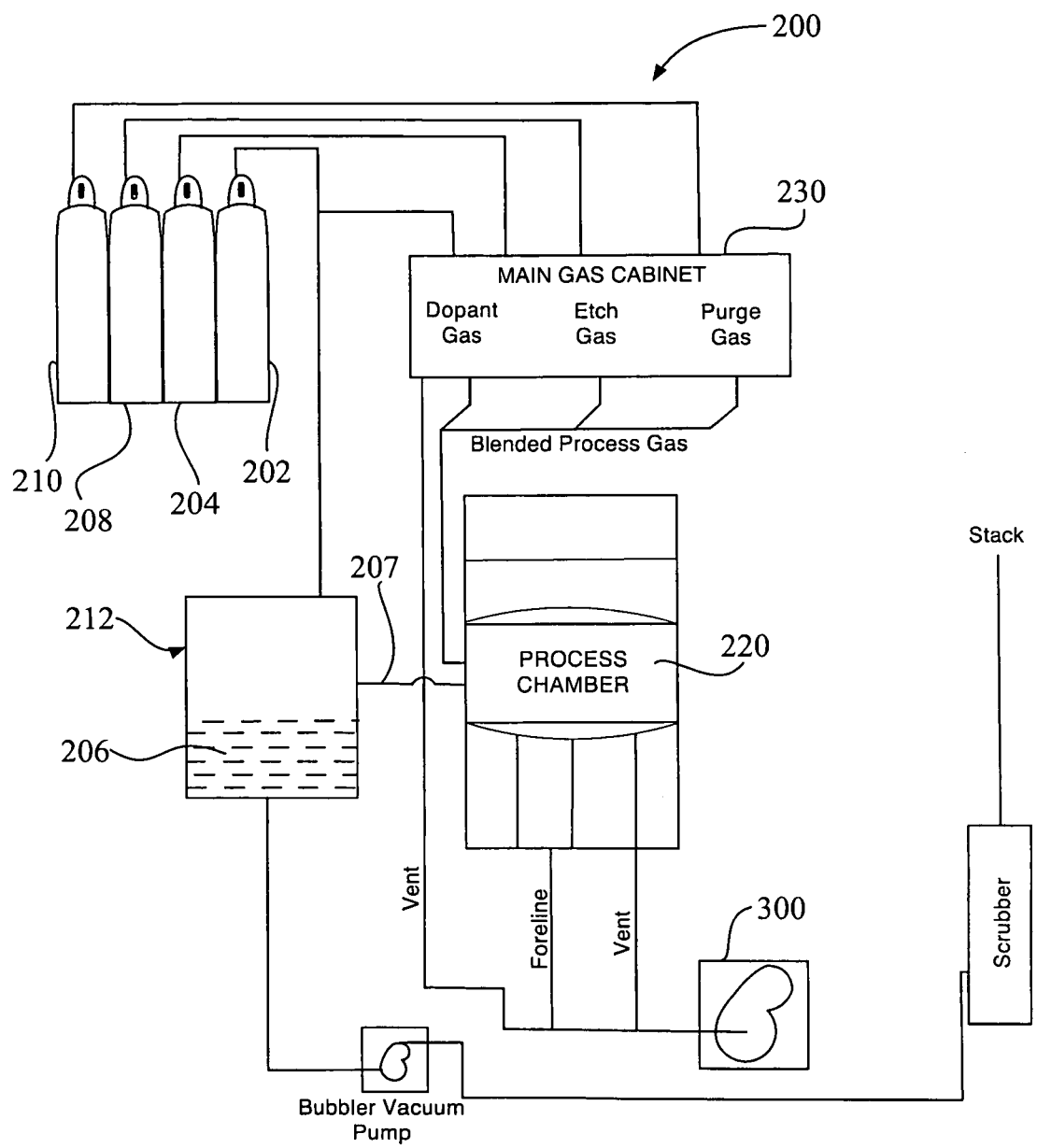
FIG. 3 is a schematic view of a reactor set up for a system employing tetrasilane, a carbon source, an etchant gas, and a carrier gas for selectively depositing silicon-containing films in accordance with a preferred embodiment.

The amount of carbon substitutionally doped into a Si-containing material may be determined by measuring the perpendicular lattice spacing of the doped Si-containing material by x-ray diffraction. See, e.g., Judy L. Hoyt, "Substitutional Carbon Incorporation and Electronic Characterization of $Si_{1-y}C_y/Si$ and $Si_{1-x-y}Ge_xC_y/Si$ Heterojunctions," Chapter 3 in "Silicon-Germanium Carbon Alloy," Taylor and Francis, N.Y., pp. 59-89, 2002. As illustrated in FIG. 3.10 at page 73 of the aforementioned article by Hoyt, the total carbon content in the doped silicon may be determined by SIMS, and the non-substitutional carbon content may be determined by subtracting the substitutional carbon content from the total carbon content. The amount of other elements substitutionally doped into other Si-containing materials may be determined in a similar manner.

Various embodiments provide methods for depositing carbon-doped Si-containing materials (such as carbon-doped single crystalline Si) using a silicon source that comprises tetrasilane, a carbon source and, optionally, source(s) of other elements such as electrical active dopant(s). Under the modified chemical vapor deposition and/or growth conditions taught herein and described in further detail below, the delivery of tetrasilane and a carbon source to the surface of a substrate preferably results in the formation of an epitaxial carbon-doped Si-containing film on the surface of the substrate. In certain selective deposition and/or growths an etchant gas may be delivered to the substrate in conjunction with tetrasilane and carbon source, and the Si-containing film is deposited selectively over single crystal substrates or single crystal regions of mixed substrates. Methods employing relatively high deposition and/or growth rates are preferred, and in preferred embodiments such methods have been found to result in the deposition and/or growth of in situ doped crystalline Si-containing materials containing relatively high levels of substitutional carbon.

"Substrate," as that term is used herein, refers either to the workpiece upon which deposition and/or growth is desired, or the surface exposed to the deposition and/or growth gas(es). For example, the substrate may be a single crystal silicon wafer, or may be a semiconductor-on-insulator (SOI) substrate, or may be an epitaxial Si, SiGe or III-V material deposited upon such wafers. Workpieces are not limited to wafers, but also include glass, plastic, or any other substrate employed in semiconductor processing. The term "mixed substrate" is known to those skilled in the art, see U.S. Pat. No. 6,900,115 which is hereby incorporated herein by reference in its entirety and particularly for the purpose of describing mixed substrates. As discussed in U.S. Pat. No. 6,900,115, a mixed substrate is a substrate that has two or more different types of surfaces. For example, a mixed substrate may comprise a first surface having a first surface morphology and a second surface having a second surface morphology. In certain embodiments, carbon-doped Si-containing layers are selectively formed over single crystal semiconductor materials while minimizing and more preferably avoiding deposition and/or growth over adjacent dielectrics. Examples of dielectric materials include silicon dioxide (including low dielectric constant forms such as carbon-doped and fluorine-doped oxides of silicon), silicon nitride, metal oxide and metal silicate. The terms "epitaxial", "epitaxially" "heteroepitaxial", "heteroepitaxially" and similar terms are used herein to refer to the deposition and/or growth of a crystalline Si-containing material onto a crystalline substrate in such a way that the deposited layer adopts or follows the lattice constant of the substrate. Epitaxial deposition and/or growth may be heteroepitaxial when the composition of the deposited layer is different from that of the substrate.

Even if the materials are made from the same element, the surfaces can be different if the morphologies (crystallinity) of the surfaces are different. The processes described herein are useful for depositing Si-containing films on a variety of substrates, but are particularly useful for mixed substrates having mixed surface morphologies. Such a mixed substrate comprises a first surface having a first surface morphology and a second surface having a second surface morphology. In this context, "surface morphology" refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by a crystal structure and orientation that is identical to the substrate upon which they are grown, typically single crystal. The atoms in these materials are arranged in a lattice-like structure that persists over relatively long distances (on an atomic scale). Amorphous morphology is a non-crystalline structure having a low degree of order because the atoms lack a definite periodic arrangement. Other morphologies include microcrystalline and mixtures of amorphous and crystalline material. As used herein, "single-crystal" or "epitaxial" is used to describe a predominantly large crystal structure that may have a tolerable number of faults therein, as is commonly employed for transistor fabrication. The skilled artisan will appreciate that crystallinity of a layer generally falls along a continuum from amorphous to polycrystalline to single-crystal; the skilled artisan can readily determine when a crystal structure can be considered single-crystal or epitaxial, despite low density faults. Specific examples of mixed substrates include without limitation single crystal/polycrystalline, single crystal/amorphous, epitaxial/polycrystalline, epitaxial/amorphous, single crystal/dielectric, epitaxial/dielectric, conductor/dielectric, and semiconductor/dielectric. The term "mixed substrate" includes substrates having more than two different types of surfaces, and thus the skilled artisan will understand that methods described herein for depositing Si-containing films onto mixed substrates having two types of surfaces may also be applied to mixed substrates having three or more different types of surfaces.

Embodiments of the invention generally provide methods and apparatus for forming and treating a silicon-containing epitaxial layer. Specific embodiments pertain to methods and apparatus for forming and treating an epitaxial layer during the manufacture of a transistor.

As used herein, epitaxial deposition and/or growth refers to the deposition and/or growth of a single crystal layer on a substrate, so that the crystal structure of the deposited layer matches the crystal structure of the substrate. Thus, an epitaxial layer or film is a single crystal layer or film having a crystal structure that matches the crystal structure of the substrate. Epitaxial layers are distinguished from bulk substrates and polysilicon layers.

Throughout the application, the terms "silicon-containing" materials, compounds, films or layers should be construed to include a composition containing at least silicon and may contain germanium, carbon, boron, arsenic, phosphorus gallium and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe for silicon germanium, Si:C for silicon carbon and SiGeC for silicon germanium carbon. The abbreviations do not represent chemical equations with stoichiometrical relationships, nor represent any particular reduction/oxidation state of the silicon-containing materials.

One or more embodiments of the invention generally provide processes to selectively and epitaxially deposit silicon-containing materials on monocrystalline surfaces of a substrate during fabrication of electronic devices. A substrate containing a monocrystalline surface (e.g., silicon or silicon germanium) and at least a secondary surface, such as an amorphous surface and/or a polycrystalline surface (e.g., oxide or nitride), is exposed to an epitaxial process to form an epitaxial layer on the monocrystalline surface while forming limited or no polycrystalline layer on the secondary surfaces. The epitaxial process typically includes repeating a cycle of a deposition and/or growth process and an etching process until the desired thickness of an epitaxial layer is grown. Exemplary alternating deposition and etch processes are disclosed in U.S. Pat. No. 7,312,128 the entire content of which is incorporated herein by reference.

In one or more embodiments, the deposition process includes exposing the substrate surface to a deposition gas containing at least a silicon source and a carrier gas, wherein the carrier has a flow rate from 0-20,000 and preferably from 2,000 to 10,000 and more preferably from 100 to 2000 times greater than the flow rate of the silicon source. The deposition gas may also include a germanium source and/or carbon source, as well as a dopant source. In particular embodiments, the deposition gas contains a sufficient amount of an n-type dopant precursor that results in the in the epitaxial film containing at least about $1\times10^{20}$ atoms/cm$^3$ of an n-type dopant. In specific embodiments, the final epitaxial film contains at least about $2\times10^{20}$ atoms/cm$^3$ of an n-type dopant, and more specifically, at least about $5\times10^{20}$ atoms/cm$^3$ of an n-type dopant. As used herein, these levels of dopant concentration will be referred to as heavily doped with an n-type dopant. Examples of suitable n-type dopants include P, As and Sb. During the deposition process, an epitaxial layer is formed on the monocrystalline surface of the substrate, while a polycrystalline/amorphous layer is formed on secondary surfaces, such as dielectric, amorphous and/or polycrystalline surfaces, which will be collectively referred to as "secondary surfaces". Subsequently, the substrate is exposed to an etching gas. Typically, the etching gas includes a carrier gas and an etchant, such as chlorine gas or hydrogen chloride. The etching gas removes silicon-containing materials deposited during the deposition process. During the etching process, the polycrystalline/amorphous layer is removed at a faster rate than the epitaxial layer. Therefore, the net result of the deposition and etching processes forms epitaxially grown silicon-containing material on monocrystalline surfaces while minimizing growth, if any, of polycrystalline/amorphous silicon-containing material on the secondary surfaces. A cycle of the deposition and etching processes may be repeated as needed to obtain the desired thickness of silicon-containing materials. The silicon-containing materials which can be deposited by embodiments of the invention include silicon, silicon germanium, silicon carbon, silicon germanium carbon, and variants thereof, including dopants.

Depending on the depth of the recess desired depositing and etching will occur for 30-50 cycles. In general, deposition processes may be conducted at lower temperatures than etching reactions, since etchants often need a high temperature to be activated. However, tetrasilane, due to the fact it can be deposited amorphously, allows for the etching process to be maintained at temperatures consistent with the deposition temperature thereby minimizing the effort to regulated and adjusted the reaction temperatures throughout the deposition process.

Hydrogen is typically a preferred carrier gas due to improved hydrogen termination. However other inert carrier gases such as argon, helium, and nitrogen may also be employed.

According to a first embodiment of the invention, blanket or nonselective epitaxy with alternating steps of deposition and etch results in improved crystallinity of epitaxial films grown using a higher order silane compared to continuous deposition. As used herein, "higher order silane" refers to a tetrasilane, or higher silane precursor. An exemplary process includes loading a substrate into a process chamber and adjusting the conditions within the process chamber to a desired temperature and pressure. Then, a deposition process is initiated to form an epitaxial layer on a monocrystalline surface of the substrate at a rate of approximately 2-4 per minute. The deposition process is then terminated.

The substrates may be unpatterned or patterned. Patterned substrates are substrates that include electronic features formed into or onto the substrate surface. The patterned substrate usually contains monocrystalline surfaces and at least one secondary or feature surface that is non-monocrystalline, such as a dielectric, polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as polysilicon, photoresist materials, oxides or nitrides, specifically silicon oxide or silicon nitride, as well as amorphous silicon surfaces or combinations thereof.

After loading a substrate into the process chamber, the conditions in the process chamber are adjusted to a predetermined temperature and pressure. The temperature is tailored to the particular conducted process. Generally, the process chamber is maintained at a temperature below about 550° C. during deposition and etching. The process chamber is usually maintained at a pressure in the range of about 10 mTorr-200 Torr, preferably 10 mTorr-50 Torr and more preferably 10 mTorr-10 Torr during deposition. The pressure may fluctuate during and between process steps, but is generally maintained constant.

During the deposition process the substrate is exposed to a deposition gas to form an epitaxial layer. The substrate is exposed to the deposition gas for a period of time of about 0.5 seconds to about 30 seconds, for example, from about 1 second to about 20 seconds, and more specifically from about 5 seconds to about 10 seconds. In a specific embodiment, the deposition step lasts for about 10 to 11 seconds. The specific exposure time of the deposition process is determined in relation to the exposure time during a subsequent etching process, as well as particular precursors and temperature used in the process. Generally, the substrate is exposed to the deposition gas long enough to form a maximized thickness of an epitaxial layer.

In one or more embodiments, the deposition gas contains at least a silicon source or precursor and a carrier gas, and may contain at least one secondary elemental source, such as a carbon source or precursor and/or a germanium source or precursor. Also, the deposition gas may further include a dopant compound to provide a source of a dopant, such as boron, arsenic, phosphorus, gallium and/or aluminum. In an alternative embodiment, the deposition gas may include at least one etchant.

The silicon sources as introduced to said chamber typically has a purity level in the range of approximately 95% to approximately 99.9% and having oxygenated impurities less than 2000 ppm and preferably having oxygenated impurities less than 2 ppm and more preferably having oxygenated impurities less than 500 ppb.

The silicon source is usually provided into the process chamber at a rate in a range from about 5 sccm to about 500 sccm, preferably from about 10 sccm to about 300 sccm, and more preferably from about 50 sccm to about 200 sccm, for example, about 100 sccm. In a specific embodiment, tetrasilane is flowed at about 60 sccm. Silicon sources useful in the deposition gas to deposit silicon-containing compounds include but are not limited to tetrasilane, halogenated tetrasilanes and organotetrasilanes. Halogenated silanes include compounds with the empirical formula $X'_y Si_4 H_{(10-y)}$, where $X'=F, Cl, Br$ or $I$. Organosilanes include compounds with the empirical formula $R_y Si_4 H_{(10-y)}$, where R=methyl, ethyl, propyl or butyl. Organosilane compounds have been found to be advantageous silicon sources as well as carbon sources in embodiments which incorporate carbon in the deposited silicon-containing compound.

The silicon source is usually provided into the process chamber along with a carrier gas. The carrier gas has a flow rate from about 1 slm (standard liters per minute) to about 50 slm, at a pressure of less than 100 Torr. For example, from about 12 slm to about 45 slm, and more specifically from about 20 slm to about 40 slm, for example, about 34 slm at a pressure of about less than 100 Torr. Carrier gases may include helium, nitrogen ($N_2$), hydrogen ($H_2$), argon, and combinations thereof. A carrier gas may be selected based on the precursor(s) used and/or the process temperature during the epitaxial process. Usually the carrier gas is the same throughout for each of the deposition and etching steps. However, some embodiments may use different carrier gases in particular steps. Typically, hydrogen is utilized as a carrier gas in embodiments featuring low temperature (e.g., less than 550° C.) processes.

The deposition gas used also contains at least one secondary elemental source, such as a carbon source and/or a germanium source. A carbon source may be added during deposition to the process chamber with the silicon source and carrier gas to form a silicon-containing compound, such as a silicon carbon material. A carbon source, i.e. 100%, is usually provided into the process chamber at a rate in the range from about 0.1 sccm to about 40 sccm, for example, from about 3 sccm to about 25 sccm, and more specifically, from about 5 sccm to about 25 sccm, for example, about 10 sccm.

Carbon sources useful to deposit silicon-containing compounds include organosilanes, cyclohexasilanes, alkyls, alkenes and alkynes of ethyl, propyl and butyl. Such carbon sources include but are not limited to carbon sources having a general formula of $Si_x H_y (CH_3)_z$, where x is an integer in the range of 1 to 6 and where y and z are each independently an integer in the range of 0 to 6, methylated cyclohexasilane or dodecamethylcyclohexasilane ($Si_6 C_{12} H_{36}$) and silylalkanes such as tetramethyldisilane (TMDS), monosilylmethane, disilylmethane, trisilylmethane and tetrasilylmethane, and/or alkylsilanes such as monomethyl silane (MMS), and dimethyl silane, methylsilane ($CH_3 SiH_3$), dimethylsilane (($CH_3$)$_2 SiH_2$), ethylsilane ($CH_3 CH_2 SiH_3$), methane ($CH_4$), ethylene ($C_2 H_4$), ethyne ($C_2 H_2$), propane ($C_3 H_8$), propene ($C_3 H_6$), butyne ($C_4 H_6$), as well as others. The carbon concentration of an epitaxial layer is in the range from about 1.8 atomic % to about 3 atomic %. Alternatively, a germanium source and a carbon source may both be added during deposition into the process chamber with the silicon source and carrier gas to form a silicon-containing compound, such as a silicon carbon or silicon germanium carbon material.

The carbon sources as introduced to said chamber typically has a purity level in the range of approximately 97% to approximately 99.9% and having oxygenated impurities less than 100 ppm and preferably having oxygenated impurities less than 10 ppm and more preferably having oxygenated impurities less than 500 ppb.

The deposition gas used during deposition may further include at least one dopant compound to provide a source of elemental dopant, such as boron, arsenic, phosphorus, gallium or aluminum. Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. In one example, the silicon-containing compound is doped n-type, such as with phosphorus, antimony and/or arsenic to a concentration in the range from about $10^{20}$ atoms/cm$^3$ to about $10^{21}$ atoms/cm$^3$.

A dopant source is usually provided into the process chamber during deposition in the range from about 0.1 sccm to about 20 sccm, for example, from about 0.5 sccm to about 10 sccm, and more specifically from about 1 sccm to about 5 sccm, for example, about 3 sccm. Dopants may also include arsine ($AsH_3$), phosphine ($PH_3$) and alkylphosphines, such as with the empirical formula $R_x PH_{(3-x)}$, where R=methyl, ethyl, propyl or butyl and x=1, 2 or 3. Alkylphosphines include trimethylphosphine (($CH_3$)$_3 P$), dimethylphosphine (($CH_3$)$_2 PH$), triethylphosphine (($CH_3 CH_2$)$_3 P$) and diethylphosphine (($CH_3 CH_2$)$_2 PH$). Aluminum and gallium dopant sources may include alkylated and/or halogenated derivates, such as described with the empirical formula $R_x MX_{(3-x)}$, where M=Al or Ga, R=methyl, ethyl, propyl or butyl, X=Cl or F and x=0, 1, 2 or 3. Examples of aluminum and gallium dopant sources include trimethylaluminum ($Me_3 Al$), triethylaluminum ($Et_3 Al$), dimethylaluminumchloride ($Me_2 AlCl$), aluminum chloride ($AlCl_3$), trimethylgallium ($Me_3 Ga$), triethylgallium ($Et_3 Ga$), dimethylgalliumchloride ($Me_2 GaCl$) and gallium chloride ($GaCl_3$).

According to one or more embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products and other contaminants. In an exemplary embodiment, the process chamber may be purged for about 10 seconds by flowing a carrier gas at about 5 slm. A cycle of deposition and etch may be repeated for numerous cycles.

In another aspect of the present invention, a blanket or non-selective deposition is performed at low temperatures, for example, below about 550° C. and lower, using a silicon source, preferably tetrasilane. This assists in amorphous growth (rather than polycrystalline) on dielectric surfaces such as oxide and nitride during the deposition step (nonselective deposition), which facilitates removal of the layer on dielectric surfaces by a subsequent etch step and minimizes damage on single crystalline layer grown on the crystalline substrate.

A typical selective epitaxy process involves a deposition reaction and an etch reaction. During the deposition process, the epitaxial layer is formed on a monocrystalline surface while a polycrystalline layer is deposited on at least a second layer, such as an existing polycrystalline layer and/or an amorphous layer. The deposition and etch reactions occur simultaneously with relatively different reaction rates to an epitaxial layer and to a polycrystalline layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on the spacer.

Selective epitaxial deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayers, such as a silicon germanium (SiGe) material. Selective epitaxy permits near complete dopant activation with in situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction. Typically, the elevated source/drain layer is undoped silicon.

Embodiments of the present invention provide selective epitaxy processes for silicon-containing films, for example, Si:C films with high substitutional carbon concentration (greater than 1.8%), which can be used for forming tensile stressed channel of N-type Metal Oxide Semiconductor Field Effect Transistor (MOSFET) structure when epitaxial films are grown on recessed source/drain of a transistor. In general, it is difficult to achieve high substitutional carbon concentration (greater than 1.8%) in Si:C epitaxy. However, tetrasilane enables high growth rates at very low temperatures.

According to one or more embodiments, the methods follow a sequential order, however, the process is not limited to the exact steps described herein. For example, other process steps can be inserted between steps as long as the order of process sequence is maintained. The individual steps of an epitaxial deposition will now be described according to one or more embodiments.

MOSFET devices formed by processes described herein may contain a pMOS component or an nMOS component. The pMOS component, with a p-type channel, has holes that are responsible for channel conduction, while the nMOS component, with a n-type channel, has electrons that are responsible channel conduction. Therefore, for example, a silicon-containing material such as SiGe may be deposited in a recessed area to form a pMOS component. In another example, a silicon-containing film such as SiC may be deposited in a recessed area to form a nMOS component. SiGe is used for pMOS application for several reasons.

Further, SiGe grown epitaxially on the top of silicon has compressive stress inside the film because the lattice constant of SiGe is larger than that of silicon. The compressive stress is transferred in the lateral dimension to create compressive strain in the pMOS channel and to increase mobility of the holes. For nMOS application, SiC can be used in the recessed areas to create tensile stress in the channel, since the lattice constant of SiC is smaller than that of silicon. The tensile stress is transferred into the channel and increases the electron mobility. Therefore, in one embodiment, a first silicon-containing layer is formed with a first lattice strain value and a second silicon-containing layer is formed with a second lattice strain value.

To achieve enhanced electron mobility in the channel of nMOS transistors having a recessed source/drain using carbon-doped silicon epitaxy, it is desirable to selectively form the carbon-doped silicon epitaxial layer on the source/drain either through selective deposition or by post-deposition processing. Furthermore, it is desirable for the carbon-doped silicon epitaxial layer to contain substitutional C atoms to induce tensile strain in the channel. Higher channel tensile strain can be achieved with increased substitutional C content in a carbon-doped silicon source and drain. Achieving a 1.5% substitutional C is equivalent to approximately a 0.5% channel strain, whereas a 2% substitutional C is equivalent to approximately a 0.8% channel strain, whereas a 2.5% substitutional C is equivalent to approximately a 1.0% channel strain and a 3% substitutional C is equivalent to approximately a 1.2% channel strain.

Methods for formation of epitaxial layers containing n-doped silicon are known in the art and are not described in detail herein. Specific embodiments pertain to the formation and treatment of epitaxial layers in semiconductor devices, for example, MOSFET devices. In specific embodiments, the formation of the n-doped epitaxial layer involves exposing a substrate in a process chamber to deposition gases including a silicon source, a carbon source and an n-dopant source at a first temperature and pressure and then exposing the substrate to an etchant without varying the temperature or the pressure.

In one example, as depicted in FIG. 1, a source/drain extension is formed within a MOSFET device 100 wherein the silicon-containing layers are epitaxially and selectively deposited on the surface of the substrate 110. A source/drain region 112 is formed by implanting ions into the surface of a substrate 110. The segments of source/drain region 112 are bridged by the gate 118 formed on gate oxide layer 116 and spacer 114.

Figure 2:
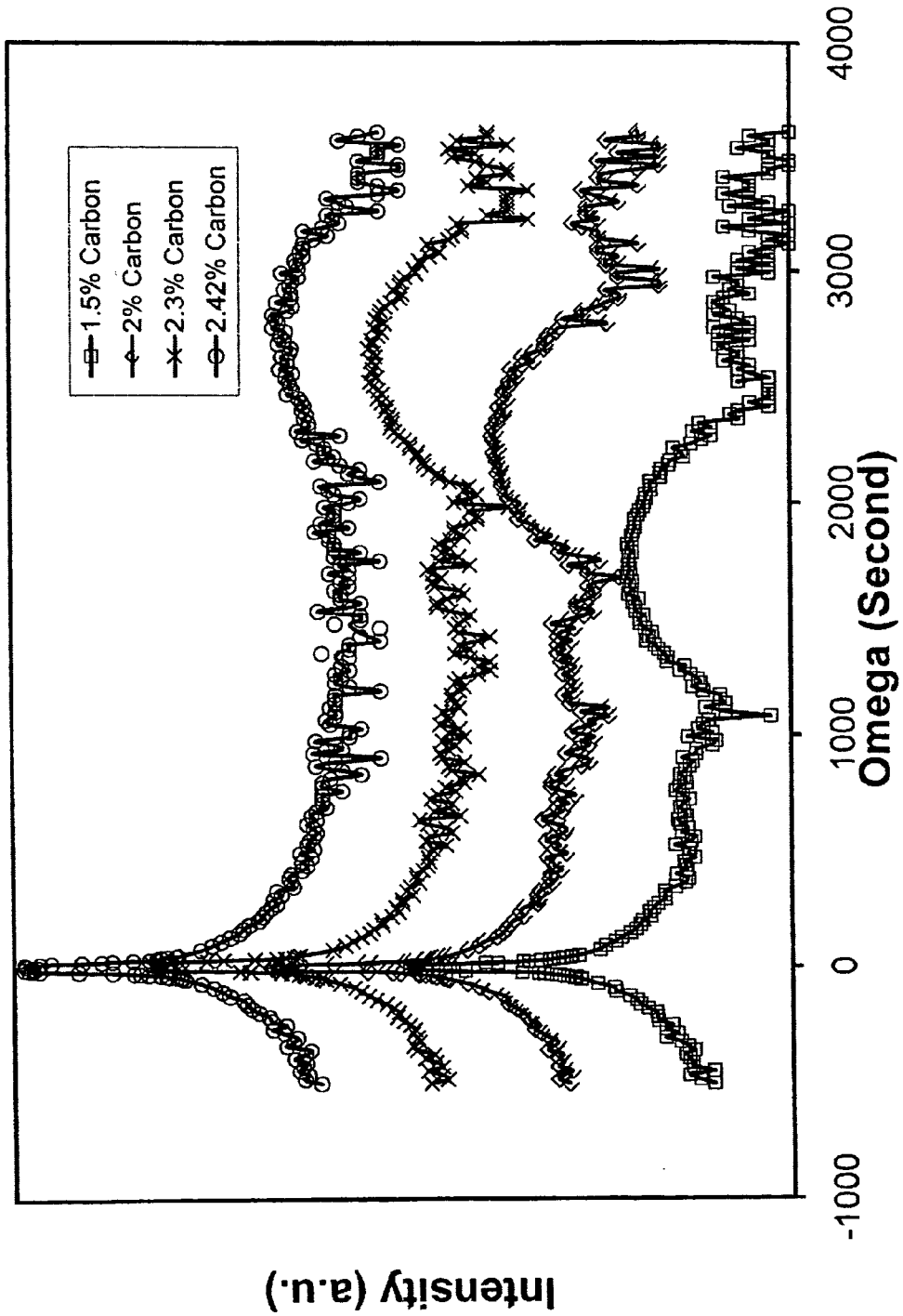
FIG. 2 is an X-ray diffraction plot demonstrating that up to 2.3% C can be incorporated with tetrasilane at 550° C.

In another example, silicon-containing epitaxial layer 120 and polycrystalline layer 122 are SiC-containing layers with a carbon concentration in a range of at least about 1.8 atomic % substitutional carbon to at least about 3.0 atomic % substitutional carbon, as determined by x-ray diffraction, as shown in FIG. 2.

In another example, silicon-containing epitaxial layer 120 and polycrystalline layer 122 are SiGe-containing layers with a germanium concentration in a range from about 1 at % to about 50 at %, preferably about 24 at % or less. Multiple SiGe-containing layers containing varying amounts of silicon and germanium may be stacked to form silicon-containing epitaxial layer 240 with a graded elemental concentration. For example, a first SiGe-layer may be deposited with a germanium concentration in a range from about 15 at % to about 25 at % and a second SiGe-layer may be deposited with a germanium concentration in a range from about 25 at % to about 35 at %.

FIG. 3 illustrates a preferred reactor system 200 employing a carrier gas 202 (helium in the illustrated embodiment), a carbon source 204 (methylsilane in the illustrated embodiment), a silicon source 206 (tetrasilane in the illustrated embodiment) and an etching gas 208. Reactor system 200 utilized by the present invention comprises a Centura® RP-CVD (Reduced Pressure-Vacuum Chemical Vapor Deposition) manufactured by Applied Materials and modified according to the present invention by adding a high flow pump 300 as discussed further below.

The gases introduced into the reactor system 200 are highly purified by a gas purifier (not shown) before being introduced into reaction chamber 220. Therefore, it is necessary to provide the gas purifier such that the gas is introduced into the reaction chamber 220 after having been purified highly. Thereby, an impurity of oxygen, water, siloxanes, carbon monoxide (CO), carbon dioxide ($CO_2$) or the like included in the gas, is minimized. Some of the carrier gas 202 flow is shunted to a vaporizer in the form of a bubbler 212, from which carrier gas 202 carries vaporized tetrasilane 207 at a ratio of approximately 0.005, thereby forming a saturated process gas.

The carrier gas 202 merges with the other reactants at the main gas cabinet 230, upstream of the injection manifold (not shown) for deposition chamber 220. A source of etchant gas 208 is also optionally provided for selective deposition processes.

As illustrated, the reactor system 200 also includes a high speed pump 300. It has been discovered that this high speed pump 300 is essential to the present invention as it allows main carrier gas 202 flowing to the chamber to flow at a much higher rate than that of tetrasilane saturated vapor 207, that is in the range of 0-20,000 and preferably from 2,000 to 10,000 and more preferably from 100 to 2000 times greater than the flow rate of the tetrasilane saturated vapor 207. These high flow rates at the low deposition temperatures, that is, less than 550° C. which are disclosed herein, minimize the incorporation of oxygen containing impurities such as but not limited to oxygen, water, carbon monoxide, carbon dioxide, siloxanes, disiloxanes, higher siloxanes into the Si film. It is preferable that the interstitial oxygen content should be 1E18 atom/$cm^3$ or lower and preferably less than 2E17 atom/$cm^3$. Interfacial oxygen content should be below SIMS detectable limits (dose at interface) with a background of 5E17 atom/$cm^3$. Interstitial carbon content should be 5E17 atom/$cm^3$ or lower. Interfacial carbon should be below SIMS detectable limits with a minimum background of 5E17 atom/$cm^3$ or lower. This requirement is accomplished as a result of the high speed pump 300 as carrier gas 202 at pressures in the range of about 10 mTorr-200 Torr, preferably 10 mTorr-50 Torr and more preferably 10 mTorr-10 Torr has a flow rate of up to 50 slm which is approximately two hundred times that of tetrasilane saturated vapor 207; consequently, impurities that may be present in reaction chamber 220 are literally diluted out.

A central controller (not shown), electrically connected to the various controllable components of reactor system 200. The controller is programmed to provide gas flows, temperatures, pressures, etc., to practice the deposition processes as described herein upon a substrate housed within reaction chamber 220. As will be appreciated by the skilled artisan, the controller typically includes a memory and a microprocessor, and may be programmed by software, hardwired or a combination of the two, and the functionality of the controller may be distributed among processors located in different physical locations. Accordingly, the controller can also represent a plurality of controllers distributed through reactor system 200.

In the illustrated embodiment, with the carbon source 204 in combination with tetrasilane saturated vapor 207, selective deposition of high substitutional carbon content Si:C can be achieved, as disclosed hereinabove. In another embodiment, the dopant hydride source 210 is preferably also provided to produce in situ doped semiconductor layers with enhanced conductivity. Preferably, for Si:C epitaxy, the dopant hydride is arsine or phosphine, and the layer is n-type doped. More preferably, for selective deposition embodiments, the diluent inert gas for the dopant hydride is also hydrogen gas. Thus, phosphine 210 and methylsilane 204 are preferably stored at their source containers in, e.g., hydrogen. Typical dopant hydride concentrations are 0.1% to 5% in hydrogen 202, more typically 0.5% to 1.0% in hydrogen for arsine and phosphine. Typical carbon source concentrations are 5% to 50% in hydrogen 202, more typically 10% to 30% in hydrogen. For example, experiments are being conducted with 20% methylsilane 204 in hydrogen 202.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The foregoing description is considered as illustrative only of the principles of the invention. Further, since numerous modifications and changes will readily occur to those skilled in the art, it is not desired to limit the invention to the exact construction and process as described above. Accordingly, all suitable modifications and equivalents may be resorted to falling within the scope of the invention as defined by the claims that follow. The words "comprise," "comprising," "include," "including," and "includes" when used in this specification and in the following claims are intended to specify the presence of stated features, integers, components, or steps, but they do not preclude the presence or addition of one or more other features, integers, components, steps, or groups thereof.

What is claimed is:
1. A method for forming an epitaxial film on a substrate in a chemical vapor deposition system, comprising:
   providing a substrate disposed within a chamber;
   introducing a silicon precursor and a carbon precursor to said chamber at a temperature of less than 550° C., wherein said silicon precursor is accompanied with a carrier gas wherein said carrier gas has a flow rate 200 times greater than the flow rate of said a silicon precursor; and forming an epitaxial film on at least a portion of said substrate wherein said epitaxial film as formed is relatively defect free, comprises in the range of at least about 1.8 atomic % to at least about 3.0 atomic percent substitutional carbon dopant and contains less than 5E17 atom/cm$^3$ oxygen.

2. The method of claim 1, wherein said silicon precursor is tetrasilane.

3. The method of claim 2, wherein said tetrasilane introduced to said chamber has a purity level in the range of approximately 95% to 99.9%.

4. The method of claim 2, wherein said tetrasilane introduced to said chamber has oxygenated impurities of less than 2000 ppm.

5. The method of claim 1, wherein said silicon precursor is a combination of one or more of the following: n-tetrasilane, iso-tetrasilane, and/or cyclo-tetrasilane.

6. The method of claim 1, wherein said carbon precursor as introduced to said chamber has a purity level in the range of approximately 97% to approximately 99.9%.

7. The method of claim 6, wherein the carbon precursor is selected from the group consisting of tetramethyldisilane (TMDS), monosilylmethane, disilylmethane, trisilylmethane, tetrasilylmethane, monomethyl silane, dimethyl silane and 1,3-disilabutane, monomethyl silane (MMS), dimethyl silane, methylsilane, dimethylsilane, ethylsilane, methane, ethylene, ethyne, propane, propene, butyne, dodecamethylcyclohexasilane, and tetramethyldisilane.

8. The method of claim 1, wherein said a carbon precursor as introduced to said chamber has oxygenated impurities of less than 100 ppm.

9. The method of claim 1, wherein the carbon precursor comprises a formula $Si_xH_y(CH_3)_z$, where x is an integer in the range of 1 to 6 and where y and z are each an independently integer in the range of 0 to 6.

10. The method of claim 1, wherein said chamber has a temperature in the range of about 250° C. to about 550° C.

11. The method of claim 1, wherein said chamber has a pressure of about 100 milliTorr to about 1 Torr.

12. A method for selectively depositing a silicon-containing material on a substrate, comprising:
positioning a substrate within a process chamber;
reducing the pressure within said process chamber to a pressure of less than about 1 Torr;
heating said substrate to a predetermined temperature of about 550° C. or less;
exposing said substrate to a process gas comprising tetrasilane and a carrier gas wherein said carrier gas flow rate is about two hundred times greater than the flow rate of said silicon precursor; and
depositing an epitaxial layer on a crystalline surface with relatively few defects.

13. The method of claim 12, wherein the silicon containing material is an epitaxy silicon layer.

14. The method of claim 12, wherein the predetermined temperature is about 350° C.

15. The method of claim 12, wherein said process gas further comprises a carbon source.

16. The method of claim 15, wherein said carbon source is selected from the group comprising a formula $Si_xH_y(CH_3)_z$, where x is an integer in the range of 1 to 6 and where y and z are each individually an integer in the range of 0 to 6.

17. The method of claim 16, wherein said carbon source consists of tetramethyldisilane and methylated cyclohexasilane.

18. A method for selectively depositing a silicon-containing material on a substrate, comprising:
positioning a substrate within a process chamber;
reducing the pressure within said process chamber to a pressure of less than about 1 Torr;
heating said substrate to a predetermined temperature of about 550° C. or less;
exposing said substrate to a process gas comprising tetrasilane and a carbon source, wherein said carbon source consists of tetramethyldisilane and methylated cyclohexasilane; and
depositing an epitaxial layer on a crystalline surface with relatively few defects.

* * * * *